(12) United States Patent
Sunaga et al.

(10) Patent No.: US 6,865,136 B2
(45) Date of Patent: Mar. 8, 2005

(54) TIMING CIRCUIT AND METHOD OF CHANGING CLOCK PERIOD

(75) Inventors: Toshio Sunaga, Shiga-ken (JP); Shinpei Watanabe, Kanagawa-ken (JP); Masaya Mori, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,057

(22) Filed: Jun. 24, 2003

(65) Prior Publication Data

US 2004/0264288 A1 Dec. 30, 2004

(51) Int. Cl.[7] .................................................. G11C 8/00
(52) U.S. Cl. .............. 365/233; 365/189.07; 365/189.09
(58) Field of Search ........................... 365/233, 189.07, 365/189.09, 189.11, 189.05, 211–212, 222, 121

(56) References Cited

U.S. PATENT DOCUMENTS

| | | | | |
|---|---|---|---|---|
| 5,375,093 A | | 12/1994 | Hirano | |
| 5,774,404 A | * | 6/1998 | Eto | 365/222 |
| 5,903,506 A | * | 5/1999 | Blodgett | 365/222 |
| 6,560,164 B2 | * | 5/2003 | Kawai et al. | 365/233 |
| 6,597,614 B2 | * | 7/2003 | Nam et al. | 365/222 |
| 6,650,581 B2 | * | 11/2003 | Hong et al. | 365/201 |
| 2003/0142566 A1 | * | 7/2003 | Sohn et al. | 365/201 |
| 2003/0210604 A1 | * | 11/2003 | Jeong et al. | 365/233 |
| 2003/0231523 A1 | * | 12/2003 | Cho et al. | 365/189.05 |

* cited by examiner

Primary Examiner—Richard Elms
Assistant Examiner—Dang Nguyen
(74) Attorney, Agent, or Firm—Margaret A. Pepper

(57) ABSTRACT

The object of this invention is to provide a timing circuit that can change a clock period with low power consumption. The timing circuit includes a clock generator 11, comparators 12 and 13 for comparing an inputted control voltage TDV and reference voltages VR, respectively, retaining circuits 18 and 19 for retaining outputs of the comparators, respectively, and circuits 20, 21 and 22 for producing timing pulses TDT as an output thereof based on outputs of the retaining circuits and clock signals outputted from the clock generator. Each comparator receives a first clock signal SS outputted from the clock generator and is operated only for a time corresponding to a short pulse width of the first clock signal SS.

12 Claims, 2 Drawing Sheets

(A)

EXAMPLE 1

(B)

EXAMPLE 2

(C)

TIMING CIRCUIT AND METHOD OF CHANGING CLOCK PERIOD

BACKGROUND OF INVENTION

The present invention generally relates to a timing circuit (control method) that can change a clock period depending on an input signal (control voltage), and more specifically, relates to a timing circuit (method) for controlling a refresh period of a DRAM depending on a temperature.

In DRAMs, data are charged in capacitors of cells as charges. Accordingly, the data (charges) will be lost as leakage current with a lapse of time. Therefore, the refresh operation is periodically required for rewriting (charging) the data (charges) of the cells.

In general, as the temperature increases, data of each cell of the DRAM is lost more quickly. Therefore, the period short enough to fully retain the data even at the maximum operating temperature of a chip including that DRAM is normally selected as a period of the refresh operation. As a result, the refresh is constantly carried out with such a selected short period regardless of the actual operation temperature of the chip, so that the power consumption for the refresh becomes large.

For example, the data retention characteristic of a DRAM is in general such that its data retention time becomes about twice longer every time the temperature of a chip drops by 10° C. Specifically, the refresh that is required per 15.6 ↑¼s at the maximum operating temperature of 70° C. may be carried out per about 500 ↑¼s, which is 32 ($2^5$) times longer, at a low temperature of 20° C. Accordingly, in many cases, at the low temperature, the refresh is performed at frequency more than 10 times an actually required period (frequency) during a data retention mode, resulting in more than 10 times consumption of useless power. Therefore, it is necessary to reduce the wasteful power consumption caused by the refresh at an ordinary temperature or a relatively low temperature.

For reducing the wasteful power consumption caused by the refresh, there is a method that obtains a refresh period depending on a temperature of a chip including a DRAM. FIG. 1 is a diagram showing conventional circuit examples for monitoring a chip temperature and obtaining a refresh period of a DRAM depending on the monitored temperature. In FIG. 1, (A) is a block diagram of a circuit comprising a ring oscillator 1 having multi-stage inverters, an operational amplifier 3 and a buffer, wherein an oscillation period of the ring oscillator 1 is buffered and a buffered output (TDT) 2 is used as a temperature dependent timing for determining a refresh period. In the circuit shown at (A) in FIG. 1, the operational amplifier 3 compares a constant reference voltage VR such as a bandgap voltage that does not depend on the temperature, and a temperature dependent voltage TDV such as a threshold voltage Vt of a MOS transistor and amplifies a difference therebetween, thereby to change the period of the ring oscillator 1. In FIG. 1, (B) and (C) show structural examples for changing the period of the ring oscillator 1, wherein (B) shows the type of controlling the current supplied to the inverters, while (C) shows the type of changing an RC time constant of a load of each inverter. In these types, when temperature drops, the period for performing the refresh is automatically made longer so that the refresh current can be reduced.

In the conventional circuit examples shown in FIG. 1, the operational amplifier 3 requires an analog circuit such as a current mirror, and a DC current of about several tens of micro-amperes flows therethrough. In general, inasmuch as the temperature is constantly monitored, such a DC current constantly flows. As a result, even if the refresh current itself can be reduced, because of the increase of the current consumption following the operation of the circuit shown in FIG. 1, the total current in a data retention mode of the DRAM may not be lowered but increased contrariwise. Specifically, there arises a problem that even if the refresh current itself is reduced, if the circuit monitoring the temperature consumes much current, the total current required during the data retention mode of the DRAM is not lowered. This problem becomes particularly serious for battery-driven devices wherein all the current in the data retention mode of the DRAM is fed from a battery.

Further, the period range that can be controlled by the output voltage range of the operational amplifier 3 of FIG. 1 is limited. Specifically, the low temperature requires a period that is several times longer than the minimum period required at the high temperature, but it is difficult to change the period over such a wide range using the circuits shown in FIG. 1, so that ideal reduction of the refresh current at the low temperature is not made possible.

SUMMARY OF INVENTION

The present invention has been made for solving the foregoing problems of the conventional technique and has an object to provide a timing circuit that can change a clock period with low power consumption.

Another object of the present invention is to provide a means and a method for reducing the total data retention current of a DRAM by reducing a current fed to a temperature monitor circuit and reducing a refresh current by changing (elongating) a refresh period depending on a monitored temperature.

According to the present invention, there is provided a timing circuit (10) for producing clocks variable depending on a temperature, wherein the timing circuit comprises a detection circuit that can detect the temperature at a predetermined sampling period and wherein the detection circuit is operated only for a time corresponding to a short pulse width of a clock signal (SS) that changes its level at the sampling period, thereby to detect the temperature.

More specifically, according to the present invention, there is provided timing circuit (10) comprising a clock generator (11); a comparator (12, 13) for comparing an inputted control voltage (TDV) and a reference voltage (VR1, VR2); a retaining circuit (18, 19) for retaining an output of the comparator; and a circuit (19, 20, 21) for producing timing pulses as an output thereof based on an output of the retaining circuit and clock signals outputted from the clock generator.

Further, according to the present invention, there is provided a method for changing a clock period, which comprises (a) a step of preparing a reference clock signal; (b) a step of detecting a temperature at a predetermined sampling period; and (c) a step of changing a period of the reference clock signal depending on the detected temperature.

DETAILED DESCRIPTION

Herein below, a preferred embodiment of the present invention will be described giving an example wherein the temperature of a chip is monitored. However, the present invention is not limited thereto, but applicable to any case wherein a physical amount such as pressure is monitored and its variation can be obtained as a voltage value (control voltage). Further, timing pulses obtained by the present invention are applicable not only to a refresh period of a DRAM but also to any use (device etc.) wherein the timing is intended to be changed depending on a varying physical amount.

Before starting the specific description of the embodiment, knowledge about variation in temperature of an IC chip including a DRAM etc., which has been the starting point of making the present invention, will be referred to. What is important upon thinking about monitoring the temperature of the chip to change the refresh period is the speed of change in temperature. The change of the chip temperature is relatively slow. When the temperature increases, heat sources are chip current itself, heat from nearby components, environment temperature, etc., and the temperature increasing speed is determined based on them and the heat capacity of the chip including a package thereof, so that the temperature does not increase so rapidly. For example, in general, it takes several tens of seconds to several minutes for the temperature to increase from about 20° C. to the maximum operating temperature of 70° C. This means that if the temperature increases slowly, it is not necessary to constantly monitor the temperature, and thus, if the temperature is monitored in a sampling manner at intervals sufficiently shorter than the temperature increasing speed, every monitored temperature represents temperatures in a considerable time length before and after the time when the temperature is monitored. Likewise, when the temperature drops, the temperature changing speed is also slow.

In general, the DRAM has a timer for performing the refresh per 15.6 ↑¼s. This 15. ↑¼s is determined assuming the refresh period required at the maximum operating temperature of the DRAM. Even if the temperature is monitored at the period of such a timer or at a period that is n times (n: arbitrary natural number, e.g. n=2 to 4) the period of the timer, it is still sufficiently shorter than the temperature changing speed that is in the order of seconds or longer. Accordingly, this timer can be used for triggering sampling of the temperature. In the present invention, based on this knowledge, a temperature monitor circuit that consumes the current is not constantly operated, but operated only for a short time (pulse width), e.g. 1 ↑¼s or less, and the refresh period is changed based on a result thereof to suppress the current increase in a control circuit, thereby reducing the data retention current at relatively low temperatures.

Figure 1:
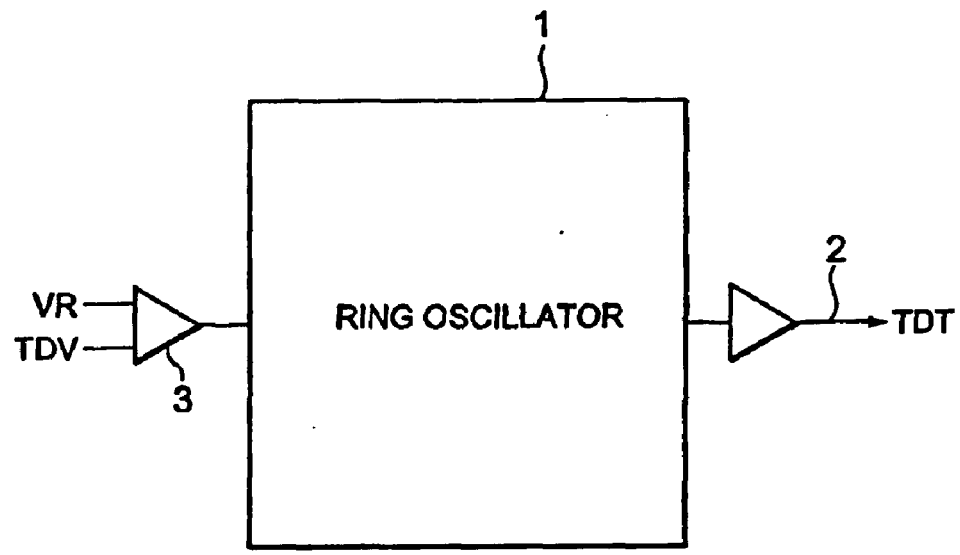
FIG. 1 is a diagram showing conventional circuit examples for obtaining a refresh period of a DRAM depending on a monitored temperature of a chip.
Figure 1:
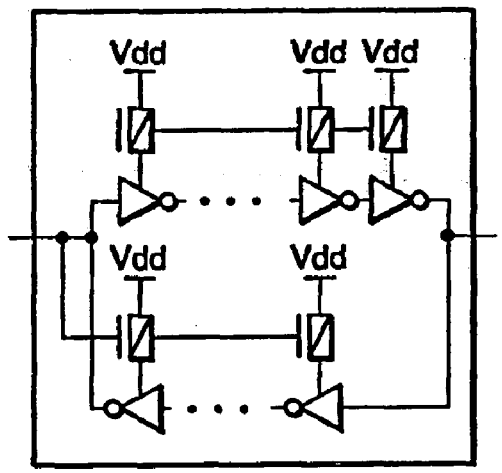
Figure 1:
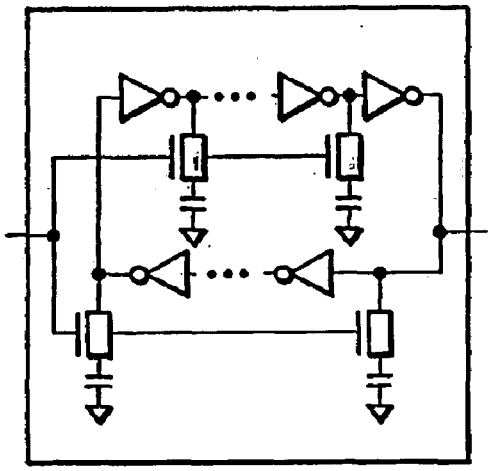
Figure 2:
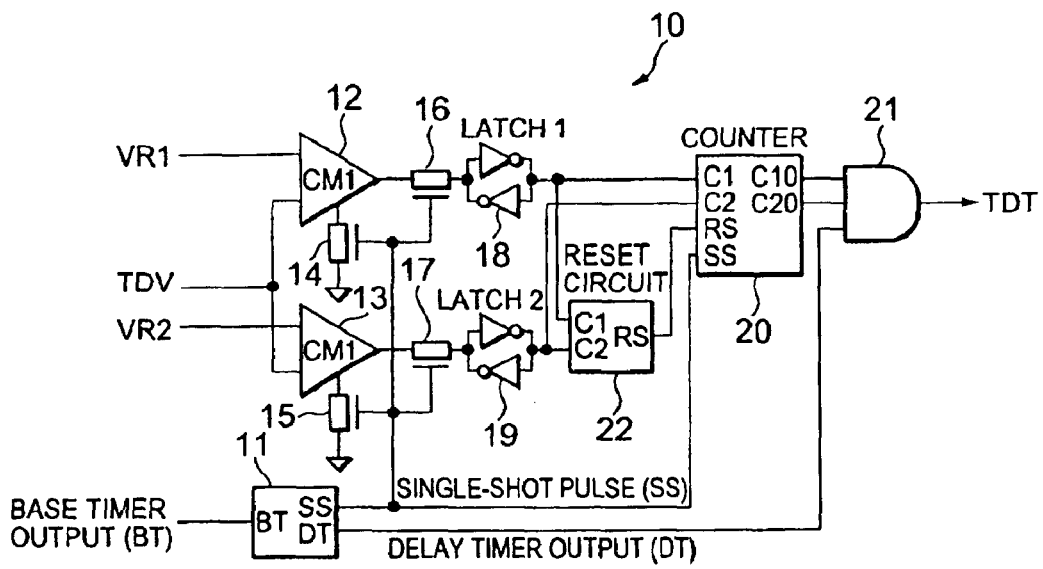
FIG. 2 is a diagram showing a preferred embodiment of a timing circuit according to the present invention.
Figure 3:
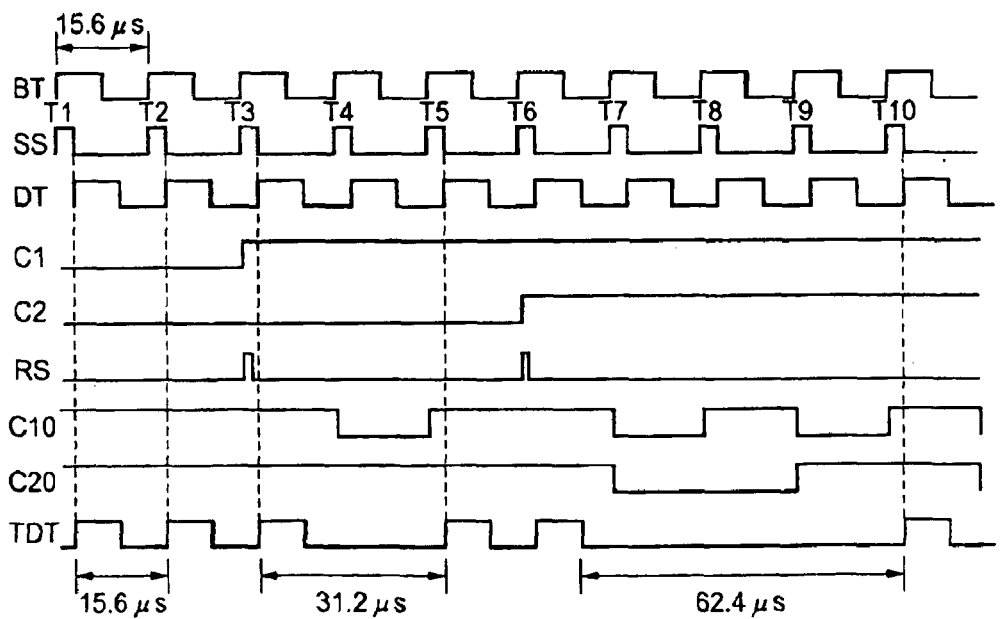
FIG. 3 is a diagram showing a timing chart of the timing circuit shown in FIG. 2.

FIG. 2 is a diagram showing a timing circuit according to the preferred embodiment of the present invention. FIG. 3 is a diagram showing a timing chart of the timing circuit shown in FIG. 2. In FIG. 2, it is assumed that an oscillation output BT having a constant period of e.g. 15.6 ↑¼s is given from a base timer (oscillator, not shown). The oscillation output BT of the base timer is inputted into a delay and single-shot circuit 11. The delay and single-shot circuit (clock generator) 11 produces a single-shot pulse SS at every leading edge of the oscillation output BT and further produces a delay timer output DT obtained by delaying the oscillation output BT by a time corresponding to a pulse width of each pulse of the single-shot pulses SS (see FIG. 3). The pulse width of the single-shot pulse SS is set to several microseconds or less (e.g. 1 ↑¼s). The period of the oscillation output BT outputted from the base timer is not limited to 15.6 ↑¼s, and a suitable period, e.g. n times (n: natural number) 15.6 ↑¼s, may be used therefor. On the other hand, it may also be configured that the delay and single-shot circuit 11 has a function of producing a suitable period such as n times (n: natural number) 15.6 ↑¼s.

In FIG. 2, CM1 12 and CM2 13 are analog comparing circuits (comparators) such as current mirrors. Each of the comparators 12 and 13 compares a temperature-dependent monitor voltage TDV such as a threshold voltage Vt of a transistor and a reference voltage VR1, VR2 such as a bandgap voltage that is not temperature-dependent. Here, it is assumed that VR1>VR2 and that TDV drops as the temperature drops like Vt. It is further assumed that when the temperature is high like 70° C., an output of each of the comparators 12 and 13 becomes HIGH, when VR1>TDV, the output of the comparator 12 becomes LOW and, when VR2>TDV, the output of the comparator 13 becomes LOW. An output stage of each of the comparators 12 and 13 is composed of a buffer circuit and outputs a full-swing potential of a CMOS.

The comparators 12 and 13 are grounded via NMOSs 14 and 15, respectively. Further, the outputs of the comparators 12 and 13 are connected to latches 18 and 19 via NMOSs 16 and 17, respectively. The gates of the NMOSs 14 to 17 are all connected to a single-shot pulse (SS) output of the delay and single-shot circuit 11. Accordingly, each of the comparators 12 and 13 is operated only when the single-shot pulse SS is outputted from the delay and single-shot circuit 11, while, for the other long time, the NMOSs 14 and 15 on the ground side are OFF so that no standby current flows. As a result, wasteful current consumption can be reduced.

The latches 18 and 19 retain comparison result outputs of the comparators 12 and 13, respectively. Outputs of the latches 18 and 19 are inputted into a counter 20. Specifically, the outputs (inverted data) of the latches 18 and 19 are inputted into C1 and C2 of the counter 20 and retained, and updated per the single-shot pulse SS inputted into the counter 20. The counter 20 is a two-bit counter with outputs C10 and C20 and counted up at each edge where the inputted pulse SS becomes HIGH, wherein the output C10 becomes an LSB and the output C20 becomes an MSB. The outputs C10 and C20 of the counter 20 are connected to an AND circuit 21. The delay timer output DT of the delay and single-shot circuit 11 is also inputted into the AND circuit 21. In FIG. 2, a reset circuit 22 is further disposed between the latches 18 and 19 and the counter 20.

An operation of the circuit shown in FIG. 2 will be described using the timing chart of FIG. 3. FIG. 3 shows a timing example assuming that the temperature of a chip is high like 70° C. (maximum operating temperature) in the beginning and then drops with a lapse of time. In other words, it is a timing example wherein the period increases as the temperature drops. First at time instants T1 to T2, the temperature is high, so that the outputs C1 and C2 of the latches 18 and 19 are both LOW, and an output TDT of the AND circuit 21 has a period of 15.6 ↑¼s, i.e. is the same as the signal DT obtained by delaying the oscillation output BT of the base timer by the pulse width of the single-shot pulse SS.

As the temperature drops and when the comparator 12 detects VR1>TDV at the timing of the single-shot pulse SS at time instant T3, the output of the comparator 12 becomes LOW and HIGH is latched as the output C1 of the latch 18. Following the change of C1 from LOW to HIGH, the reset circuit 22 produces a HIGH pulse as its output RS thereby to reset both the counter outputs C10 and C20 to HIGH. In FIG. 3, it is seen that C10 and C20 are unchanged at time instant T3, because both are HIGH before the resetting and then reset to HIGH. Here, the counter outputs C10 and C20 become "11", and then C10 being the LSB becomes LOW at time instant T4 when the next single-shot pulse SS is inputted. Therefore, at time instant T4, a pulse of the delay timer output DT is not outputted as the output TDT of the AND circuit 21. In response to the next single-shot pulse SS at time instant T5, C10 is counted up to HIGH. On the other hand, since the temperature is still in the range of VR1>TDV>VR2, the output of the comparator 13 remains HIGH and thus the output C2 of the latch 19 remains LOW. Accordingly, a pulse of the delay timer output DT is outputted as the output TDT of the AND circuit 21 at time instant T5, so that the period of the TDT becomes 31.2 μs that is twice 15.6 μs.

Subsequently, the temperature further drops before time instant T6 and, when VR2>TDV, the output of the comparator 13 becomes LOW and the output C2 of the latch 19 becomes HIGH. Following this change of C2, the counter 20 is reset by the output RS of the reset circuit 22 so that the counter outputs C10 and C20 become "11". Therefore, a pulse of the delay timer output DT is outputted as the output TDT of the AND circuit 21 at time instant T6. Then, since a two-bit counter operation is started from here, the AND circuit 21 produces the next pulse of DT as its output TDT at time instant T10 when the outputs C10 and C20 both become HIGH. As a result, when the temperature drops to VR2>TDV, the output TDT has pulses at a period of 62.4 μs that is four times 15.6 μs.

In FIG. 3, it is assumed that the temperature has passed the reference levels at time instants T3 and T6, for explaining the operation within the short timing chart. However, the temperature change actually takes more time. The role of the reset circuit 22 is to count up the counter 20 from "11" every time the period changes. Otherwise, the period becomes longer than a primarily determined value depending on the timing. For example, when C20 of the counter 20 is LOW at T7 not at T6, if not reset, C10 and C20 both become LOW at T7, and the counter 20 counts up from "00". Then, C10 and C20 become "11" at T10. However, since there is no pulse at T6, the period of the output TDT becomes first 78 μs and subsequently 62.4 μs that has been determined, which will cause an unstable operation. The reset circuit 22 prevents this unstable operation.

In the timing circuit of the present invention, inasmuch as the analog circuits (comparators 12 and 13) that consume the current are turned on only for a time corresponding to the pulse width of the single-shot pulse SS, the power consumption can be largely reduced. For example, if the pulse width of the pulse SS is about 1 μs, the analog circuits (comparators 12 and 13) can be fully operated, and further, since this time is sufficiently shorter than 15.6 μs of the base timer, the average current consumption of the analog circuits becomes 1 μs. Further, the temperature sampling interval may be several times (e.g. 2 to 4 times) 15.6 μs in view of the temperature changing speed and, if the sampling is performed at such a period, the average current consumption can be reduced to 1 μs or less even in case of an analog circuit where the current of several tens of micro-amperes flows.

For simplification, explanation has been made using the two-bit counter in the foregoing embodiment. However, by increasing the number of bits, the reference voltage VR can be divided into more reference voltages so that the period changing range can be easily enlarged like 2–4–8 times with 3 bits and 24–8–16 times with 4 bits. Further, in the foregoing embodiment, the multiple conversion of the period is carried out using the counter. However, the present invention is not limited thereto. Another method may be used wherein, for example, the temperature is measured by sampling and a result thereof is directly retained in the latches 18 and 19 in a digital amount, thereby changing the period using it.

A detection circuit is included that can detect the physical amount such as temperature at a predetermined sampling period, and the detection circuit is operated only for a time corresponding to a short pulse width of a clock signal that changes its level at the sampling period, thereby to perform the detection. Accordingly, the power consumption upon the detection can be largely reduced.

For example, in the embodiment of FIG. 2, by increasing the number of bits of the counter, the reference voltage VR can be divided into more reference voltages so that the period changing range can be easily enlarged like 24–8 times with 3 bits and 2–4–8–16 times with 4 bits.

When the present invention is applied to the refresh of a DRAM, the refresh period can be optimized depending on the temperature and the power consumption for the refresh can be reduced.

When the present invention is applied to a battery-driven portable terminal etc., it can contribute to prolongation of the substantial life of a battery through reduction in power consumption.

What is claimed is:

1. A timing circuit comprising:

a clock generator;

a comparator for comparing an inputted control voltage and a reference voltage, wherein said comparator receives a first clock signal outputted from said clock generator and is operated only for a time corresponding to a short pulse width of said first clock signal;

a retaining circuit for retaining an output of said comparator; and a circuit for producing timing pulses as an output thereof based on an output of said retaining circuit and clock signals outputted from said clock generator.

2. A timing circuit according to claim 1, wherein said circuit for producing said timing pulses comprises:

a counter for receiving the output of said retaining circuit and a first clock signal outputted from said clock generator; and a logic circuit for receiving an output of said counter and a second clock signal outputted from said clock generator.

3. A timing circuit according to claim 2, further comprising a circuit for receiving the output of said retaining circuit and sending a reset signal to said counter.

4. A timing circuit according to claim 1, wherein said comparator comprises:

a first comparator for receiving a first reference voltage and said control voltage; and a second comparator for receiving a second reference voltage and said control voltage.

5. A timing circuit according to claim 4, wherein said retaining circuit comprises:

a first latch circuit for receiving an output of said first comparator; and a second latch circuit for receiving an output of said second comparator.

6. A timing circuit according to claim 2, wherein said logic circuit comprises an AND circuit.

7. A timing circuit for producing clocks variable depending on a temperature, said timing circuit comprising a detection circuit that can detect the temperature at a predetermined sampling period, wherein said detection circuit is operated only for a time corresponding to a short pulse width of a clock signal that changes its level at said sampling period, thereby to detect the temperature.

8. A timing circuit for controlling a refresh period of a DRAM depending a temperature, said timing circuit comprising a detection circuit that can detect the temperature at a predetermined sampling period, wherein said detection circuit is operated only for a time corresponding to a short pulse width of a clock signal that changes its level at said sampling period, thereby to detect the temperature.

9. A timing circuit according to claim 8, wherein said sampling period is a period determined by T×n where T represents a refresh period required at the maximum operating temperature of the DRAM and n represents an arbitrary natural number.

10. A method for changing a clock period, comprising:
(a) a step of preparing a reference clock signal;
(b) a step of detecting a temperature at a predetermined sampling period and only for a time corresponding to a short pulse width of a clock signal that changes its level at said sampling period; and
(c) a step of changing a period of said reference clock signal depending on said detected temperature.

11. A method according to claim 10, wherein said step (c) comprises a step of producing a clock signal having a longer period by increasing the number of pulses decimated from said reference clock signal depending on dropping of said detected temperature.

12. A method according to claim 10, wherein said sampling period is a period determined by T×n where T represents the period of said reference clock signal and n represents an arbitrary natural number, and said natural number n is set to a large value when the changing speed of the temperature is slow, and to a small value when the changing speed of the temperature is fast.

* * * * *